US 6,529,416 B2

(12) United States Patent
Bruce et al.

(10) Patent No.: US 6,529,416 B2
(45) Date of Patent: Mar. 4, 2003

(54) PARALLEL ERASE OPERATIONS IN MEMORY SYSTEMS

(75) Inventors: Ricardo H. Bruce, Union City; Rolando H. Bruce, S. San Francisco, both of CA (US)

(73) Assignee: BiTMICRO Networks, Inc., Fremont, CA (US)

( * ) Notice: Subject to any disclaimer, the term of this patent is extended or adjusted under 35 U.S.C. 154(b) by 28 days.

(21) Appl. No.: 09/819,423

(22) Filed: Mar. 27, 2001

(65) Prior Publication Data

US 2002/0097594 A1 Jul. 25, 2002

Related U.S. Application Data (60) Provisional application No. 60/250,642, filed on Nov. 30, 2000.

(51) Int. Cl.[7] .............................................. G11C 16/04
(52) U.S. Cl. ............................ 365/185.33; 365/185.29
(58) Field of Search ........................ 365/185.33, 189.05, 365/230.08, 218, 222, 185.29

(56) References Cited

U.S. PATENT DOCUMENTS

| 5,703,823 A | * 12/1997 | Douse et al. ................ 365/222 |
| 5,822,251 A | 10/1998 | Bruce et al. ............ 365/185.33 |
| 5,956,743 A | 9/1999 | Bruce et al. ................ 711/103 |
| 6,000,006 A | 12/1999 | Bruce et al. ................ 711/103 |

* cited by examiner

*Primary Examiner*—A. Zarabian
(74) *Attorney, Agent, or Firm*—Mikio Ishimaru; Stephen R. Uriarte (57) ABSTRACT

An apparatus for and method of memory operation having a memory, a cache containing a plurality of entries with a plurality of the entries to be written to memory, a detector for detecting in the cache the plurality of entries to be written to memory, and a processor for erasing a first portion of the memory to accommodate the plurality of entries to be written to memory and writing to the first portion of the memory the plurality of entries to be written to memory wherein an erase operation is followed by a plurality of sequential write operations.

20 Claims, 5 Drawing Sheets

PARALLEL ERASE OPERATIONS IN MEMORY SYSTEMS

CROSS-REFERENCE TO RELATED APPLICATION(S)

This application claims the benefit of U.S. Provisional patent application serial No. 60/250,642 filed Nov. 30, 2000.

FIELD OF THE INVENTION

The present invention relates generally to memory storage systems, and more particularly to flash memory systems.

BACKGROUND OF THE INVENTION

Computer systems have traditionally used hard disk systems with rotating magnetic disks as data storage media. However, disk drives are disadvantageous in that they are bulky and they require high precision moving mechanical parts. They are also not rugged and are prone to reliability problems, as well as consuming significant amounts of power.

More recently these hard disk systems are being replaced by semiconductor systems. These semiconductor systems use electrically erasable programmable read-only-memory (EEPROM) technology as memory storage cells as a substitute for the hard-disk magnetic media. The EEPROMs have the capability of electrically erasing data stored on the memory and replacing it with other data. However, programming the EEPROM is relatively slow since input/output of data and addressing is in a serial format. Additionally, special "high" voltages are required when programming the EEPROM. Even further, EEPROMs are typically only available in relatively small memory sizes such as 8 Kbyte or 16 Kbyte sizes. As more and more non-volatile memory space is required at lower power consumption for portable electronic apparatus, alternatives to EEPROM are required.

"Flash" EEPROM, also known as "flash memory", has been the answer. Large regions of flash memory can be erased at one time which makes reprogramming flash memory faster than reprogramming EEPROM and which is the origin of the term "flash". Additionally, it has lower stand-by power consumption than EEPROM. Also, in replacing hard disk systems, these flash memory systems are sometimes referred to as flash "disk" systems and similar descriptive terminology is used, even though no rotating magnetic disks are used.

In the flash memory system, a plurality of flash memory chips are arranged in banks hat share some of the control signals from a buffer chip. The flash memory chips are nonvolatile semiconductor-memory chips that retain data when power is no longer applied.

The flash memory chips are divided into pages and blocks. A 64 Mbit flash chip typically has 512-byte pages, which happens to match the sector size for IDE and small-computer system interface (SCSI) hard disks. Rather than writing to or reading from just one word in the page, the entire page must be read or written at the same time; individual bytes cannot be written. Thus flash memory operations are inherently slow since an entire page must be read or written.

Flash memory is also not truly random-access. While reads can be to random pages, writes require that memory cells must first be erased before information is placed in them; i.e., a write (or program) operation is always preceded by an erase operation.

The erase operation is done in one of several ways. For example, in some flash memories, the entire chip is erased at one time. If not all the information in the chip is to be erased, the information must first be temporarily saved, and is usually written into another memory (typically a RAM). The information is then restored into the nonvolatile flash memory by programming back into the chip.

In other flash memories, the memory is divided into blocks that are each separately erasable, but only one at a time. By selecting the desired block and going through the erase sequence the designated area is erased. While, the need for temporary memory is reduced, erase in various areas of the memory still requires a time consuming sequential approach.

In still other flash memories, the memory is divided into sectors where all cells within each sector are erasable together. Each sector can be addressed separately and selected for erase.

In even other flash memories, certain numbers of blocks are reserved to be pre-erased and a logical block address (LBA) to physical block address (PBA) translation must be performed.

While flash reads can be to random pages, flash writes require that larger regions, such as a sector, block, or chip be erased in a flash erase operation before a flash write can be performed. For example, in block erases, a block of 16 pages must be erased together, while all 512 bytes on a page must be written together.

In all these flash memories, flash erase operations are significantly slower than flash read or write operations. Further, only one erase operation per flash memory chip can be active at a time.

Since the time taken by the flash erase and the write operations affect the operating speed of the entire flash memory system, a way of speeding up these operations has been long sought, but has equally as long eluded those skilled in the art.

Working from another direction, those skilled in the art have developed cache memories to speed up the performance of computer systems having slower access devices, such as flash memory. Typically, a part of system RAM is used as a cache for temporarily holding the most recently accessed data from the flash memory system. The next time the data is needed, it may be obtained from the fast cache instead of the slow flash memory system. This technique works well in situations where the same data is repeatedly operated on. This is the case in most structures and programs since the computer tends to work within a small area of memory at a time in running a program.

Most of the conventional cache designs are read caches for speeding up reads from flash memory. In some cases, write caches are used for speeding up writes to flash memory. However, in the case of writes to flash memory systems, data is written to flash memory directly every time they occur, while being written into cache at the same time. This is done because of concern for loss of updated data files in case of power loss. If the write data is only stored in the cache memory, which is a volatile memory, a loss of power will result in new updated files being lost from the cache before having the old data updated in non-volatile flash memory. The system will then be operating on the old data when these files are used in further processing. The need to write to flash memory every time is considered by those skilled in the art to defeat the benefits of the caching mechanism for writes. Read caching does not have this concern since the data that could be lost from cache has a backup in flash memory.

Those skilled in the art have also used direct-memory access (DMA) to facilitate data transfers. While DMA is efficient for transfers of raw data to a memory, flash memory chips also require command and address sequences to set up the relatively long flash operations. Unfortunately, DMA is not well suited to transfer addresses and commands since it is designed to transfer long strings of data beginning at a starting address through an ending address.

Thus, those skilled in the art working from different directions have encountered what appears to be an insurmountable bottleneck in speeding up flash memory systems to match faster and faster host computer system processors.

SUMMARY OF THE INVENTION

A method of memory operation providing a memory, a cache containing a plurality of entries with a plurality of the entries to be written to memory, a detector for detecting in the cache the plurality of entries to be written to memory, and erasing a first portion of the memory to accommodate the plurality of entries to be written to memory and writing to the first portion of the memory the plurality of entries to be written to memory in which an erase operation is followed by a plurality of sequential write operations. Since the time taken by the flash erase and the write operations affect the operating speed of the entire flash memory system, the present invention provides a way of substantially speeding up these operations.

A memory system having a memory, a cache containing a plurality of entries with a plurality of the entries to be written to memory, a detector for detecting in the cache the plurality of entries to be written to memory, and a processor for erasing a first portion of the memory to accommodate the plurality of entries to be written to memory and writing to the first portion of the memory the plurality of entries to be written to memory in which an erase operation is followed by a plurality of sequential write operations. Since the time taken by the flash erase and the write operations affect the operating speed of the entire flash memory system, the present invention provides a fast memory system.

The above and additional advantages of the present invention will become apparent to those skilled in the art from a reading of the following detailed description when taken in conjunction with the accompanying drawings.

DETAILED DESCRIPTION OF THE PREFERRED EMBODIMENTS

Figure 1:
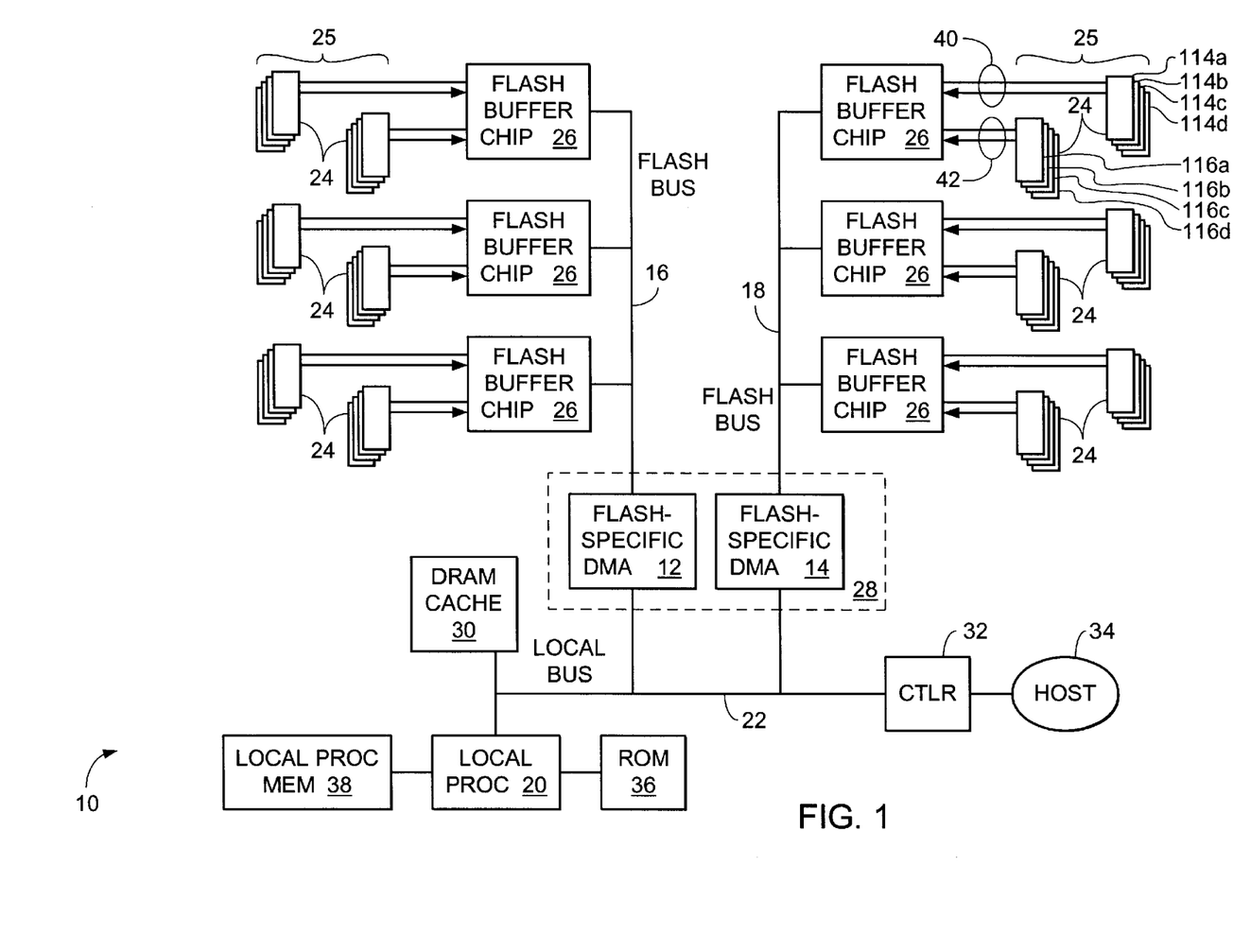
FIG. 1 is a block diagram of a flash memory system in accordance with one embodiment of the present invention.

FIG. 1 is a block diagram of a flash memory system 10 having at least one flash specific DMA controller coupled to each flash bus used in the system. In the embodiment shown, two DMA controllers are used with DMA controller 12 coupled to flash bus 16 and DMA controller 14 coupled to flash bus 18. The number of DMA controllers for each flash bus or the number of flash buses shown is not intended to limit the present invention in any way and may be increased to improve performance. Flash memory systems are known, such as that described in U.S. Pat. No. 5,822,251.

In operation, local processor 20 sends high-level requests to flash chips 24 via local bus 22. Each request is translated into a sequence of commands, address bytes and data transfers ("command sequence") by either DMA controller 12 or 14. DMA controller 12 or 14 in turn transfers the command sequence to a flash buffer chip ("buffer chip") by using shared data/address/command lines that comprise the flash bus. Each buffer chip 26 is coupled to at one bank of flash chips 24 via a buffer bus, such as buffer bus 40 and 42. In addition to the shared data/address/command lines, flash buses 16 and 18 also have lines for transmitting an encoded command. The encoded command is used to select and control a plurality of buffer chips 26. In one embodiment, there are 8 multiplexed data/address/command lines and 2 encoded command lines. Thus, each flash bus has an 8-bit portion destined for the buffer chips or for the flash memory chips 24, and a 2-bit portion sent only to buffer chips 26.

Each buffer chip 26 buffers at least one bank of flash memory chips 24 and also serves as a protocol converter by using a protocol defined for the flash buses to transceive command sequences on the flash buses and by converting the protocol to another protocol expected by a flash memory chip, such as flash chip 114a, 114b, 114c or 114d. This could be as simple as converting flash bus commands to the appropriate sequence of signal transitions to a flash memory chip, or could involve translation of commands or addresses, or even more complex sequencing. In one embodiment, the commands on the flash bus are kept similar to those expected by the flash chips to minimize the cost of conversion and thus keep buffer chips 26 simple.

DMA controllers 12 and 14 drive flash buses 16 and 18, respectively. Flash buses 16 and 18 can operate at the same time, allowing flash operations to be initiated and processed in parallel. Each buffer chip 26 controls at least one bank of flash memory chips 24. Each bank can be separately accessed, allowing flash chips to perform flash operations in parallel with flash chips in other banks. In addition, each flash chip within the same bank can also be separately accessed, allowing flash operations to be performed in parallel on more than one flash chip within the same bank of flash chips. Hence, not only can parallel flash operations be performed on different flash chips belonging to separate banks but also on flash chips belonging to the same bank of flash chips.

Each buffer chip 26 may be coupled to any number, such as four, of banks of flash chips 24 although only two banks per buffer chip are shown in FIG. 1 to avoid overcomplicating the present invention. Each bank has eight flash memory chips 24 although only four flash chips are shown, such as flash-chips 114a through 114d and 116a through 116d. Additional banks of flash memory chips can be added to an existing buffer bus, or modules of flash memory chips with a buffer chip can be coupled to a flash bus. The ability to add additional flash buses facilitates expansion since any number of buffer chips can be added. Buffer chips monitor flash operations performed by flash chips, permitting the buffer chips to indicate to DMA controllers 12 and 14 which flash chips 24 are busy and enabling the DMA controllers to perform additional flash operations to other flash chips.

DMA controllers 12 and 14 may be contained in a single Application-Specific Integrated Circuit (ASIC) 28. The ASIC 28 connects DMA controllers 12 and 14 to local bus 22. In another embodiment, the DMA controllers are integrated in any chip in the flash memory system 10, which facilitates data transfer between the flash chips and local bus 22. For example, one DMA controller may be integrated with each of buffer chips 26 instead of being integrated together in the ASIC 28.

Local bus 22 connects a cache 30, local processor 20, and an interface controller 32, such as a small-computer system interface (SCSI), ATA/IDE, or another interface controller, to DMA controllers 12 and 14. Host requests from a host 34 are received by interface controller 32 and driven onto local bus 22. Local processor 20 responds to the host requests by storing host data into cache 30 for writes, or reading data from the flash memory chips 24 or from cache 30. A read-only memory (ROM) 36 contains firmware code of routines that execute on local processor 20 to respond to host requests. Other system-maintenance routines are stored on ROM 36, such as wear-leveling and copy-back routines.

Cache 30 is under firmware control by local processor 20, and thus the local processor's local memory 38 and cache 30 may share the same physical memory. Cache 30 is implemented using DRAM although this is not intended to limit the present invention in any way. Cache 30 is used as a cache for temporarily holding the most recently accessed data from flash memory system 10. The next time the data is needed by the host 34, it may be obtained from cache 30 instead of the relatively slower flash memory 25. This technique works well in situations where the same data is repeatedly operated on as is the case in most structures and programs since host 34 tends to work within a small area of memory at a time in running a program. In one embodiment, cache 30 has a cache size of 32 MB for a 256 MB flash memory.

Local processor 20 also tracks data stored in cache 30 and can determine if the data, such as a cache block or cache sector/page, is "dirty", or has been updated more recently than the copy of the data stored in flash memory 25. This permits host 34 to use the most recent copy of the data and, when the dirty data is to be "victimized", or replaced, with other data, the dirty data is first written to flash memory 25 so that any changes that were made to the dirty data will be preserved. This technique is well known to those skilled in the art. This cache coherency process permits local processor 20 to determine when dirty cache data is ready to be written to flash memory 25.

Local processor 20 initiates write or read transactions by sending high-level commands to one of the DMA controllers 12 or 14. DMA controller 12 or 14 then generates the corresponding command sequences. Many command sequences may be needed, such as for block reads and writes. A block read requires that many page read command sequences be performed, each sequence generally sending command and address bytes to flash memory chips 24 through the buffer chips 26. Some flash chips also have a sequential read mode where command and address bytes need only be sent for the first page in a sequence.

Local processor 20 uses DMA transfers to move data between one of the DMA controllers coupled to the flash buses and cache 20. The DMA transfers may be performed by local processor 20 using program control or may be facilitated using at least one additional DMA controller (not shown) that is either integrated with local processor 20 or implemented separately and coupled to local bus 22.

Figure 2:
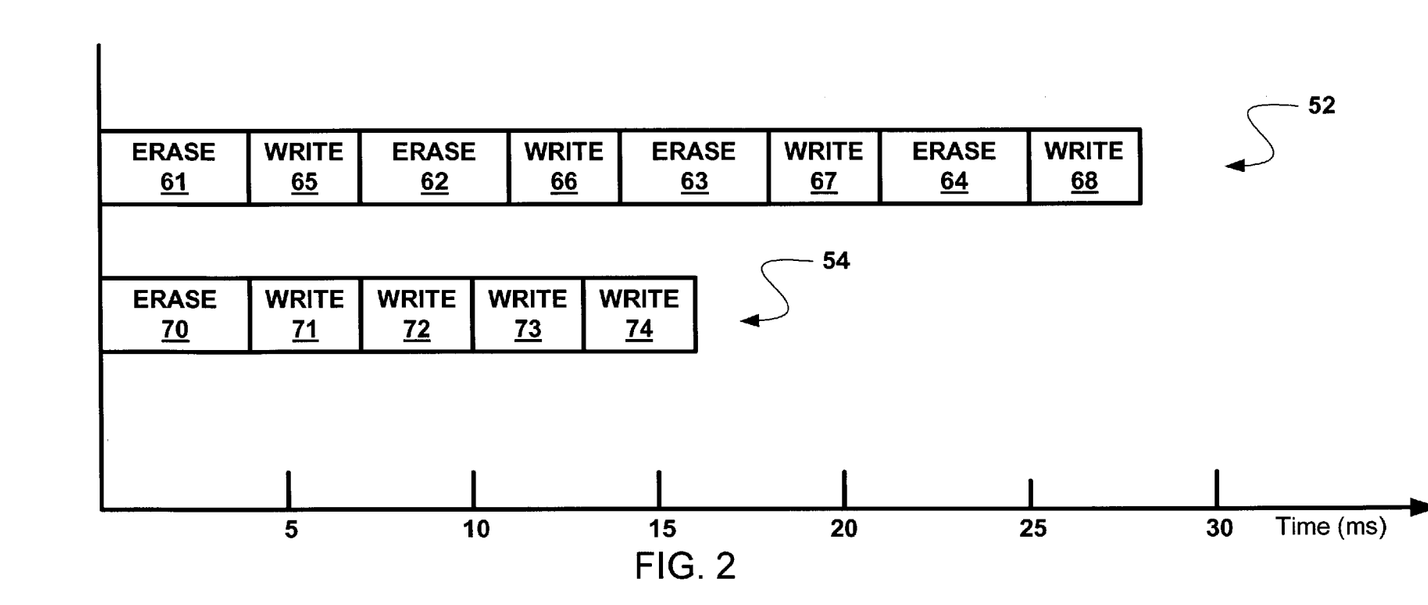
FIG. 2 is a time chart showing conventional alternating flash erase and write operations, parallel flash erase and write operations of the present invention, and parallel-parallel flash erase and write operations in accordance with another embodiment of the present invention.

Conventional flash memory, such as flash chips 114a through 114d and 116a through 116d, operate differently from DRAM devices in many respects. For instance, a flash block selected for a write transaction must first erase the block targeted for the write transaction before the block can be written with data. Performing and completing an erase cycle before performing a write cycle adds an additional delay. Referring to FIG. 2, a time chart 50 is shown that depicts alternating erase and write cycles 52 that are performed in conventional flash memory. The erase cycles have flash erase times 61 through 64, respectively, and the write cycles have write times 65 through 68, respectively. In a typical flash chip used by the inventors listed herewith, each erase cycle takes approximately 4 ms to perform, while performing each write cycle takes approximately 3 ms. Thus, the total elapsed time to perform four write transactions, for example, is the first erase cycle time 61 plus the first write cycle time 65 plus the second erase cycle time 62 plus the second write cycle time 66 plus the third erase cycle time 63 plus the third write cycle time 67 plus the fourth erase cycle time 64 plus the fourth write cycle time 68. At 4 millisecond per erase cycle and 3 milliseconds per write cycle, the total time for four conventional erases and writes is 28 ms.

The present invention minimizes the above described cumulative delays by determining which cache blocks need write transactions and which of the erase cycles associated with the write transactions can be performed before performing the write cycles associated with the erase cycles. The erase cycles are performed as a group (in "parallel") before performing the write cycles. This approach reduces the total time to perform write transactions when compared to traditional methods. Performing erase cycles in parallel ("parallel erase operation") may only be done using separate flash chips although flash chips belonging to the same bank of flash chips are considered as separate flash chips and may be erased as part of the parallel operation.

Figure 3:
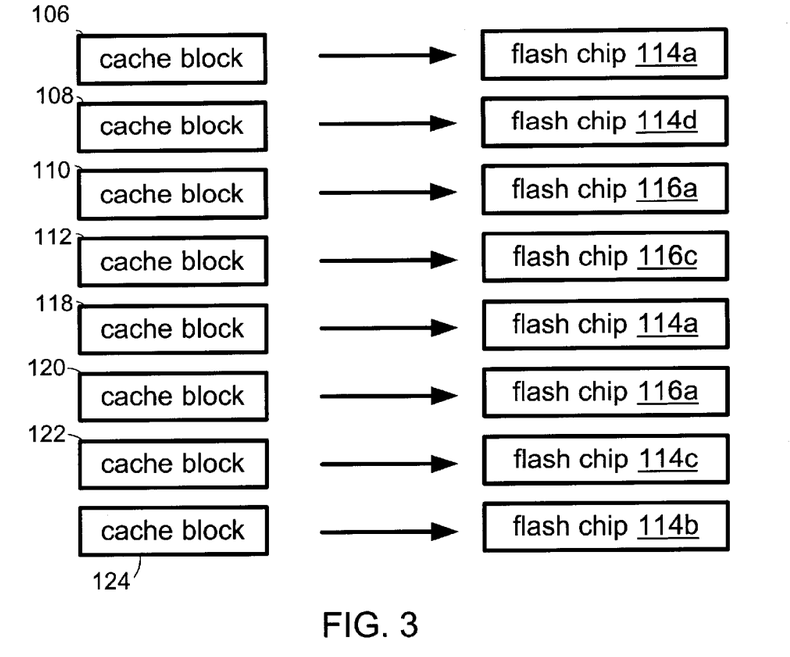
FIG. 3 shows an example list of cache blocks that require write transactions.

For example, FIG. 3 shows a list of cache blocks that require write transactions. Specifically, cache blocks 106, 108, 110, and 112 require a write transaction to flash chips 114a, 114d, 116a and 116c, respectively. Cache blocks 118 and 120 require a write transaction to flash chips 114a and 116a, respectively, while cache blocks 122 and 124 require a write transaction to flash chips 114c and 114b, respectively. Cache blocks 106, 108, 110 and 112 qualify for a parallel erase operation since they require write transactions to separate flash chips. Cache blocks 118 and 120 also qualify for a parallel erase operation but cannot be performed in parallel with the parallel erase operation for cache blocks 106, 108, 110 and 112 because they require erase cycles to the same flash chips as cache blocks 112 and 120. Consequently, the present invention, either DMA 14 or local processor through program code, selects either set of cache blocks as eligible for write transactions that involve a parallel erase operation. Upon completion of all of the erase cycles by the respective flash chips, the DMC then transmits a series of write commands as group to the erased flash chips via flash bus 18. The erased flash chips then perform write cycles on the flash blocks that were erased.

Write transactions are then performed on the next set of cache blocks that are eligible, such as cache blocks 112 and 120, for a parallel erase operation. The cache blocks that are eligible for a group or parallel erase are cache blocks 122 and 124, as shown in FIG. 3. This set of cache blocks were not included with the first group of cache blocks because they are preceded by cache blocks 118 and 120, which required erase cycles to be performed by the same flash chips used in the first group of cache blocks.

In yet another embodiment of the present invention, the ideal number of dirty cache entries, which trigger an erase, is heuristically determined to achieve optimal performance as would be evident to those skilled in the art. One factor in the determination is that a flash memory cell is currently capable of being cycled a limited number of times before the erases irrevocably damage the memory cell. Thus, one objective is to minimize the number of erases and another is to spread the erases over different flash memory chips 24.

The determination as to which of the cache blocks requiring a write transaction qualify for a group erase may be performed while the blocks are either in cache 30 or in a pending queue, which in one embodiment of the present invention, are provided for each DMA coupled to a flash bus, such as DMA controller 12 and DMA controller 14. In addition, the set of blocks selected are those that are the first eligible group which will not cause the parallel erase cycles to be performed on the same flash chip at the same time although this is not intended to limit the present invention in any way.

Figure 4:
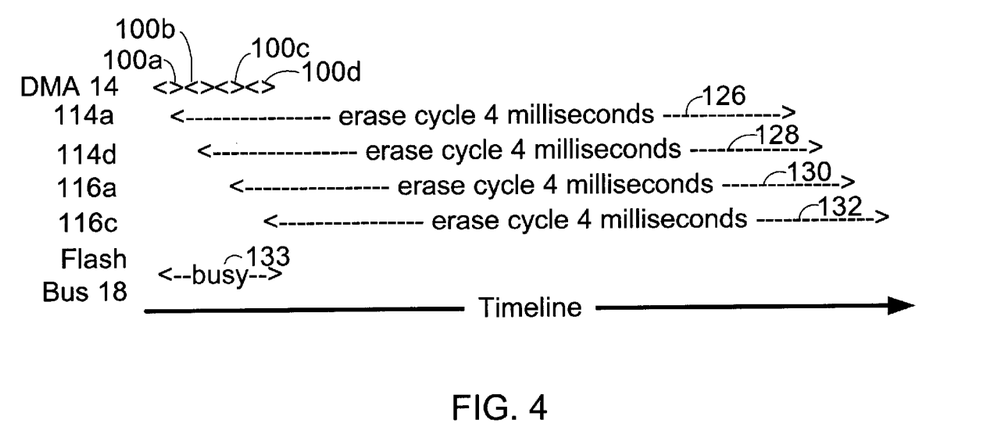
FIG. 4 shows example erase command sequences performed in response to certain cache blocks shown in FIG. 3 in accordance with one embodiment of the present invention.
Figure 5:
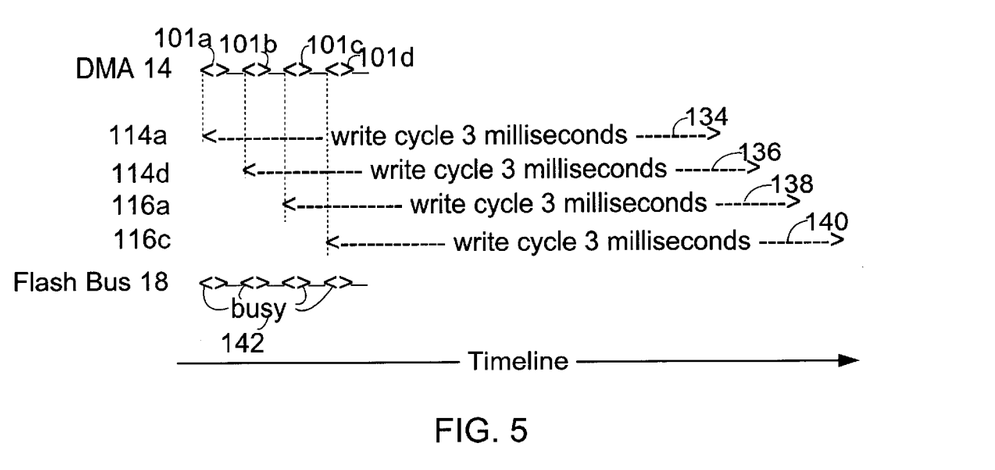
FIG. 5 shows example write command sequences performed in response to certain erase command sequences shown in accordance with one embodiment of the present invention.

FIG. 4 is a representation of the erase command sequences for cache blocks 106, 108, 110 and 112 that are performed by DMA controller 14 and the resulting erase cycles 126, 128, 130 and 132 performed by flash chips 114a, 114d, 116a and 116c, respectively, on the flash blocks (not shown) that correspond to cache blocks 106, 108, 110 and 112 in accordance with one embodiment of the present invention. FIG. 5 is a representation of the write command sequences for cache blocks 106, 108, 110, and 112 that are performed by DMA controller 14 and the resulting write cycles 134, 136, 138 and 140 performed by flash 10 chips on the flash blocks 114a, 114c, 116a and 116d that correspond to cache blocks 106, 108, 110 and 112 in accordance with one embodiment of the present invention.

As seen in FIG. 4, erase command sequences 101a, 101b, 101c and 101d directed at flash chips 114a, 114d, 116a and 116c, respectively, are launched in a sequential manner by DMA controller 14 on flash bus 18, rendering flash bus 18 unavailable 133 during the launching of the commands. The erase command sequences are launched in response to the write transactions requested for cache blocks 106, 108, 110 and 113. Flash chips 114a, 114d, 116a and 116c receive their respective erase command sequence and each consumes approximately four (4) milliseconds to perform an erase cycle in response to each erase command sequence. Although the erase command sequences are asserted sequentially, each erase command sequence takes only microseconds to complete, enabling the flash chips to perform the erase cycles as a group or in parallel.

Referring to FIG. 5, write command sequences 101a, 101b, 101c and 101d directed at flash chips 114a, 114d, 116a and 116c, respectively, are launched in a sequential manner by DMA controller 14 on flash bus 18. Like the erase command sequences above, this renders flash bus 18 busy 142 during the launching of the commands. The write command sequences are launched as part of the write transactions requested for cache blocks 106, 108, 110 and 113 and after the erase cycle that corresponds to the write cycle has been completed. Flash chips 114a, 114d, 116a and 116c receive their respective write command sequence and each consumes approximately three (3) milliseconds to perform a write cycle in response to each write command sequence.

Thus, although the erase and write commands are launched on flash bus 18 sequentially, the commands consume a fraction of the time that a flash device consumes when performing an erase or write operation since the time to assert the command sequences on flash bus 18 take microseconds to perform rather than milliseconds. This permits the flash chips to perform the erase operations essentially in parallel, greatly reducing the cumulative time to complete write transactions when compared to the example discussed in FIG. 2. Performance is further enhanced because more than one DMA controller is provided. Each DMA controller is able to launch new flash operations simultaneously, allowing different flash chips to perform separate flash operations at the same time and to further increase parallelism.

Figure 6:
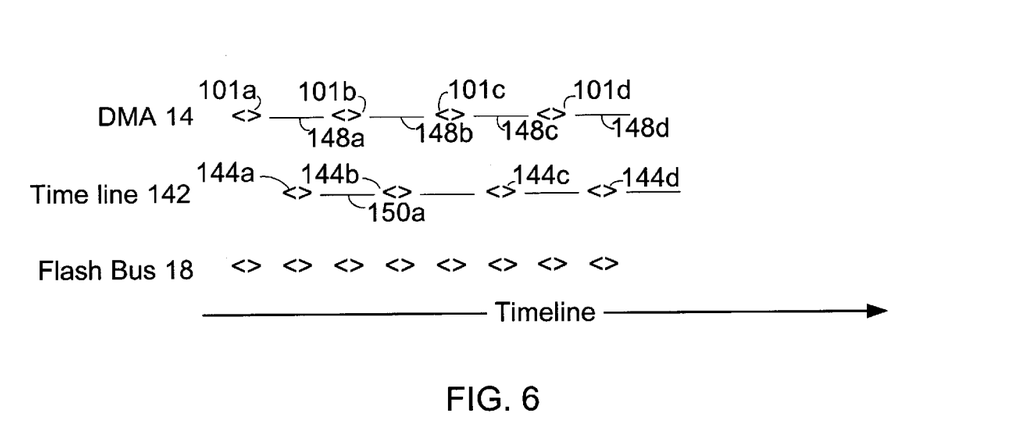
FIG. 6 shows write command sequences that may be asserted on the same flash bus by two different DMA controllers so as to interleave the write commands in accordance with a further embodiment of the present invention.

FIG. 6 shows write command sequences that may be asserted on the same flash bus by two different DMA controllers so as to interleave the write commands in accordance with a further embodiment of the present invention. To minimize over-complicating the discussion herein, write command sequences 101a, 101b, 101c and 101d shown in FIG. 5 are also shown in FIG. 6. Time line 142 represents write command sequences 144a, 144b, 144c and 144d that are asserted by another DMA controller on the same flash bus used by DMA controller 14, which in this example is flash bus 18. Write command sequences 144a, 144b, 144c and 144d are asserted only when the write command sequences asserted by DMA controller 14 are in an idle mode, such as when after a write command sequence is received by a flash chip and DMA controller 14 is waiting to receive an acknowledgement from the flash chip that it completed a program cycle. Each write command sequence 144a, 144b, 144c and 144d is followed by a corresponding program command sequence 148a, 1448b, 148c and 148d, respectively. During this program command sequence, the present invention permits a different DMA controller to assert a write command sequence on flash bus 18 that is then followed by a program sequence, such as program sequence 150a. Program sequence 150a preferably occurs during the same period as the occurrence of write command sequence 101b. Thus, by interleaving write command sequences asserted by different DMA controllers on the same flash bus, bandwidth efficiency on flash bus 18 may be improved since each write command sequence may be followed by another write command sequence. Write command sequences 144a through 144b correspond to previous erase command sequences (not shown).

In operation, local processor 20 or the DMA controller 14 detects which cache entries need to be written to flash memory, such as cache entries that are dirty, and causes an erase to be performed first to open up flash memory space on a schedule or on demand. An example of erasing on demand would be after a predetermined number of the writes and of erasing on demand would be when a cache entry is dirty but will be delayed in being written but the location of the stale entry in the flash memory is known so it can be erased. This latter technique also permits entries to be moved around in the flash memory to even the wear on the memory cells.

Increasing parallelism as describe above has a cost in that the local processor 20 will have to spend more and more of its time managing writes and less time performing other necessary operations which will slow down the overall operation of the flash memory system 10. To address this problem with the local processor 20, the present inventors suggest using at least one dedicated DMA controller for transferring data between DMA controllers attached to flash buses, such as DMA controllers 12 and 14 and cache 30 in yet another embodiment of the present invention. Preferably, there is one dedicated DMA controller for each DMA controller attached to the flash bus. During data transfer, transfer is controlled by the dedicated DMA controller, obviating the need for control by a program in the local processor 20 and, at the end of the transfer, the relevant status could be posted to the local processor 20. When local processor 20 sends a data transfer command to the dedicated DMA controller, it specifies management information that comprises a transfer start address and a transfer count for each of the transfer source and transfer destination. The area specified in this manner is transferred in sequence as one group of data blocks.

Figure 7:
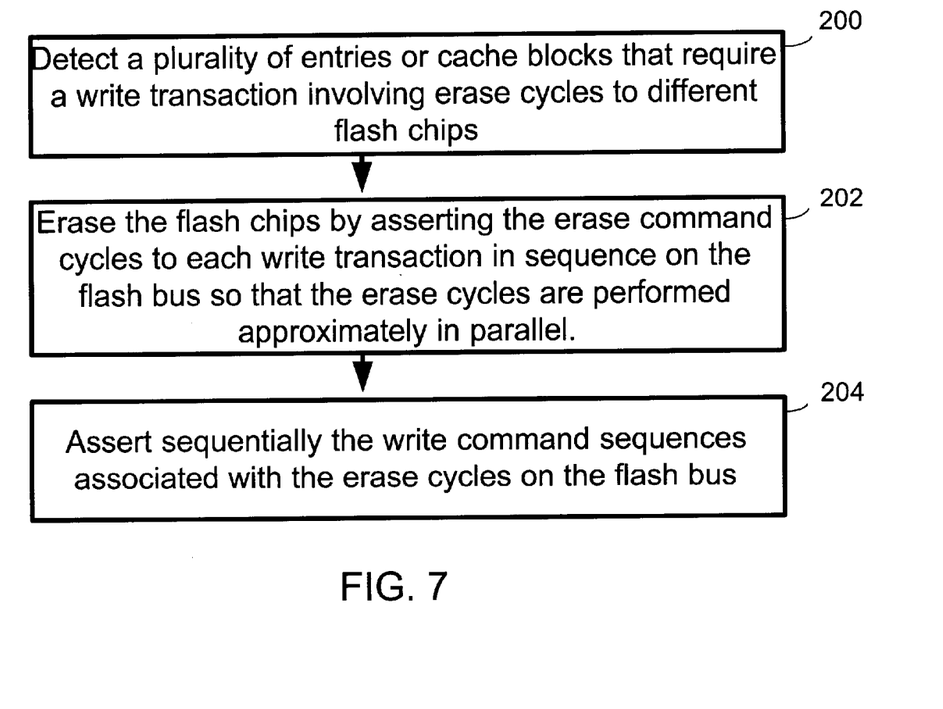
FIG. 7 shows a method of performing a parallel-erase operation in accordance with one embodiment of the present invention.

FIG. 7 is a process flow showing a method of performing a parallel erase operation in accordance with one embodiment of the present invention.

At reference 200, a plurality of entries or cache blocks that require a write transaction involving erase cycles to different flash chips are detected.

At reference 202, the flash chips are erased approximately in parallel by asserting the erase command cycles to each write transaction in sequence on the flash bus.

At reference 204, write command sequences are sequentially asserted on the flash bus. Please note that each command sequence includes a program command sequence.

Figure 8:
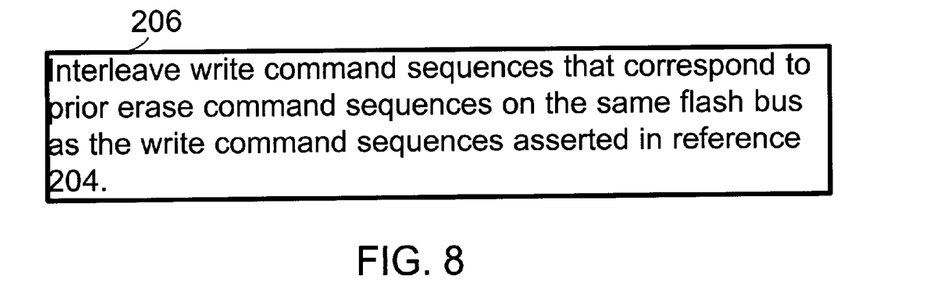
FIG. 8 shows a method of interleaving write command sequences in accordance with yet one embodiment of the present invention.

In yet a further embodiment of the present invention as shown in FIG. 8, reference 206 may be performed by interleaving write command sequences that correspond to prior erase command sequences on the same flash bus as the write command sequences asserted in reference 204.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. A method of memory operation comprising:
   providing a memory;
   providing a cache containing a plurality of entries with a plurality of the entries to be written to the memory;
   detecting in the cache the plurality of entries to be written to memory;
   erasing a first portion of the memory to accommodate the plurality of entries to be written to memory; and
   writing to the first portion of the memory the plurality of entries to be written to the memory wherein an erase operation is followed by a plurality of sequential write operations.

2. The method as claimed in claim 1 wherein the detecting uses circuitry selected from a group of circuitry consisting of a local processor, a direct memory access controller, a memory-specific direct memory access controller, and a combination thereof.

3. The method as claimed in claim 1 including:
   detecting a second plurality of entries to be written to the memory; and
   writing to the first portion of the memory the second plurality of entries to be written to the memory wherein a plurality of erase operations followed by a plurality of sequential write operations is performed in parallel.

4. The method as claimed in claim 1 including:
   detecting a second plurality of entries to be written to the memory;
   erasing a second portion of the memory to accommodate the second plurality of entries to be written to the memory; and
   writing to the second portion of the memory the second plurality of entries to be written to the memory wherein a plurality of erase operations followed by a plurality of sequential write operations is performed in parallel.

5. The method as claimed in claim 1 wherein the erasing is performed on a basis selected from a group consisting of a schedule, a demand, and a combination thereof.

6. A method of flash memory operation comprising:
   providing a flash memory;
   providing a cache containing a plurality of entries with a plurality of dirty entries to be written to the flash memory;
   detecting in the cache the plurality of dirty entries to be written to the flash memory;
   erasing a first portion of the flash memory to accommodate the plurality of dirty entries to be written to the flash memory; and
   writing to the first portion of the flash memory the plurality of dirty entries to be written to the flash memory wherein an erase operation is followed by a plurality of sequential write operations.

7. The method as claimed in claim 6 wherein the detecting uses circuitry selected from a group of circuitry consisting of a local processor, a direct memory access controller, a flash-specific direct memory access controller, and a combination thereof.

8. The method as claimed in claim 6 including:
   detecting a second plurality of dirty entries to be written to the flash memory; and
   writing to the first portion of the flash memory the second plurality of dirty entries to be written to the flash memory wherein a plurality of erase operations followed by a plurality of sequential write operations is performed in parallel.

9. The method as claimed in claim 6 including:
   detecting a second plurality of dirty entries to be written to the flash memory;
   erasing a second portion of the flash memory to accommodate the second plurality of dirty entries to be written to the flash memory; and
   writing to the second portion of the flash memory the second plurality of dirty entries to be written to the flash memory wherein a plurality of erase operations followed by a plurality of sequential write operations is performed in parallel.

10. The method as claimed in claim 6 wherein the erasing is performed on a basis selected from a group consisting of a schedule, a demand, and a combination thereof.

11. A memory system comprising:

a memory;

a cache containing a plurality of entries with a plurality of the entries to be written to memory;

a detector for detecting in the cache the plurality of entries to be written to the memory; and a processor for erasing a first portion of the memory to accommodate the plurality of entries to be written to the memory and for writing to the first portion of the memory the plurality of entries to be written to the memory wherein an erase operation is followed by a plurality of sequential write operations.

12. The memory system as claimed in claim 11 wherein detector uses circuitry selected from a group of circuitry consisting of a local processor, a direct memory access controller, a memory-specific direct memory access controller, and a combination thereof.

13. The memory system as claimed in claim 11 wherein:

the detector detects a second plurality of entries to be written to the memory; and the processor writes to the first portion of the memory the second plurality of entries to be written to the memory wherein a plurality of erase operations followed by a plurality of sequential write operations is performed in parallel.

14. The memory system as claimed in claim 11 wherein:

the detector detects a second plurality of entries to be written to the memory; and the processor erases a second portion of the memory to accommodate the second plurality of entries to be written to the memory and writes to the second portion of the memory the second plurality of entries to be written to the memory wherein a plurality of erase operations followed by a plurality of sequential write operations is performed in parallel.

15. The memory system as claimed in claim 11 wherein the processor erases are performed on a basis selected from a group consisting of a schedule, a demand, and a combination thereof.

16. A memory system of flash memory operation comprising:

a flash memory;

a cache containing a plurality of entries with a plurality of dirty entries to be written to the flash memory;

a detector for detecting in the cache the plurality of dirty entries to be written to the flash memory; and a processor for erasing a first portion of the flash memory to accommodate the plurality of dirty entries to be written to the flash memory and writing to the first portion of the flash memory the plurality of dirty entries to be written to the flash memory wherein an erase operation is followed by a plurality of sequential write operations.

17. The memory system as claimed in claim 16 wherein the detector uses circuitry selected from a group of circuitry consisting of a local processor, a direct memory access controller, a flash-specific direct memory access controller, and a combination thereof.

18. The memory system as claimed in claim 16 wherein:

the detector detects a second plurality of dirty entries to be written to the flash memory; and writes to the first portion of the flash memory the second plurality of dirty entries to be written to the flash memory wherein a plurality of erase operations followed by a plurality of sequential write operations is performed in parallel.

19. The memory system as claimed in claim 16 wherein:

the detector detects a second plurality of dirty entries to be written to the flash memory; and the processor erases a second portion of the flash memory to accommodate the second plurality of dirty entries to be written to the flash memory and writes to the second portion of the flash memory the second plurality of dirty entries to be written to the flash memory wherein a plurality of erase operations followed by a plurality of sequential write operations is performed in parallel.

20. The memory system as claimed in claim 16 wherein the processor performs erases on a basis selected from a group consisting of a schedule, a demand, and a combination thereof.

* * * * *